US006731517B1

(12) United States Patent
Yu

(10) Patent No.: US 6,731,517 B1
(45) Date of Patent: May 4, 2004

(54) CARD EDGE CONNECTOR WITH METAL SPRINGS

(75) Inventor: Hung-Chi Yu, Tu-chen (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/387,822

(22) Filed: Mar. 12, 2003

(51) Int. Cl.$^{7}$ .......................... H05K 7/02; H01R 13/00

(52) U.S. Cl. ...................... 361/807; 361/758; 439/325; 439/571

(58) Field of Search ................................ 361/807, 752, 361/728, 729, 730, 736, 741, 758; 439/325, 326, 328, 570, 571

(56) References Cited

U.S. PATENT DOCUMENTS 5,938,463 A * 8/1999 Yodogawa .................. 439/326
5,997,332 A * 12/1999 Choy ......................... 439/328
6,231,364 B1 * 5/2001 Liu ............................ 439/326
6,234,821 B1 * 5/2001 Tan ............................ 439/328
6,280,247 B1 * 8/2001 Wu et al. .................. 439/570

* cited by examiner

*Primary Examiner*—David Martin
*Assistant Examiner*—Dameon E. Levi
(74) *Attorney, Agent, or Firm*—Wei Te Chung

(57) ABSTRACT

A card edge connector (10) for electrically interconnecting a daughter board to a mother board includes an insulating housing (11), a plurality of contacts (16) retained in the housing, a pair of side arms (14) integrally extending from opposite ends of the housing, and a pair of metal springs (17) attached on corresponding side arms. Each side arm forms a platform (12) for supporting the daughter board, each platform defining thereon a reversed L-shaped, retention slit (15). Each metal spring has a retention member (174) retained in corresponding retention slit and a board-mounted member (173) for soldering on the mother board. The board-mounted member has substantial resilience which can be deformable when soldering the contacts on the mother board to thereby facilitate the stability of the assembly of the card edge connector.

5 Claims, 3 Drawing Sheets

CARD EDGE CONNECTOR WITH METAL SPRINGS

BACKGROUND OF THE INVENTION

1. Field of the Invention

The present invention generally relates to an electrical connector, and particularly to an electrical card edge connector for connecting a daughter board, such as a card memory module, to a mother board.

2. Description of Prior Arts

Memory modules that comprise memory chips mounted on a daughter board are often connected to a mother board of an electronic device, such as a personal computer, by means of a card edge connector, for example, a memory socket connector. The card edge connector provides electrical connection between the daughter board and the mother board. An example of the memory socket is the so-called SO DIMM connector which allows the daughter board to be mounted to the mother board in such a way that the daughter board and the mother board are substantially parallel to each other. As known to the skilled person in the art, the card edge connector is mounted on the mother board through Surface-mount Technology. Before soldering the contacts to the surface of the mother board, metal springs are often employed to be assembled to the side arms of the connector. The metal springs share pressures exerted on the contacts to thereby protect the contacts from deformation/distortion. U.S. Pat. Nos. 6,464,514, 6,419,513, 6,030,245, 6,162,069, and 5,997,330 disclose such type card edge connectors. However,the metal springs described in the above-mentioned patents are all integrally formed with an ejector which complexes the manufacture of the connector. On the other hand, the structure of the conventional metal springs is easily subject to a deformation when used in a heightened card edge connector by way of increasing the whole height thereof directly.

Hence, it is desirable and more cost effective to have an improved metal spring to be employed in a heightened card edge connector.

BRIEF SUMMARY OF THE INVENTION

Accordingly, it is an object of the present invention to provide a high-rise card edge connector with metal springs that increase the stability of assembling the connector on a mother board.

It is another object of the present invention to provide a high-rise card edge connector with metal springs that facilitate the soldering of the contacts on a mother board.

In order to achieve the above-mentioned objects, a card edge connector in accordance with the present invention, which is adapted for electrically interconnecting a daughter board to a mother board, includes an insulating housing defining a central slot for receiving an edge of the daughter board, a plurality of contacts retained in the housing, a pair of side arms integrally extending from opposite ends of the housing, and a pair of metal springs attached on corresponding side arms. Each side arm has an inner surface forming a platform for supporting the daughter board, each platform defining thereon a reversed L-shaped, retention slit. Each metal spring has a retention member retained in corresponding retention slit and a resilient, board-mounted member for soldering on the mother board. The resilient, board-mounted member has substantial resilience which can be deformable when soldering the contacts on the mother board to thereby facilitate the whole stability of the assembly of the card edge connector on the mother board.

Other objects, advantages and novel features of the invention will become more apparent from the following detailed description of the present embodiment when taken in conjunction with the accompanying drawings.

DETAILED DESCRIPTION OF THE INVENTION

Figure 1:
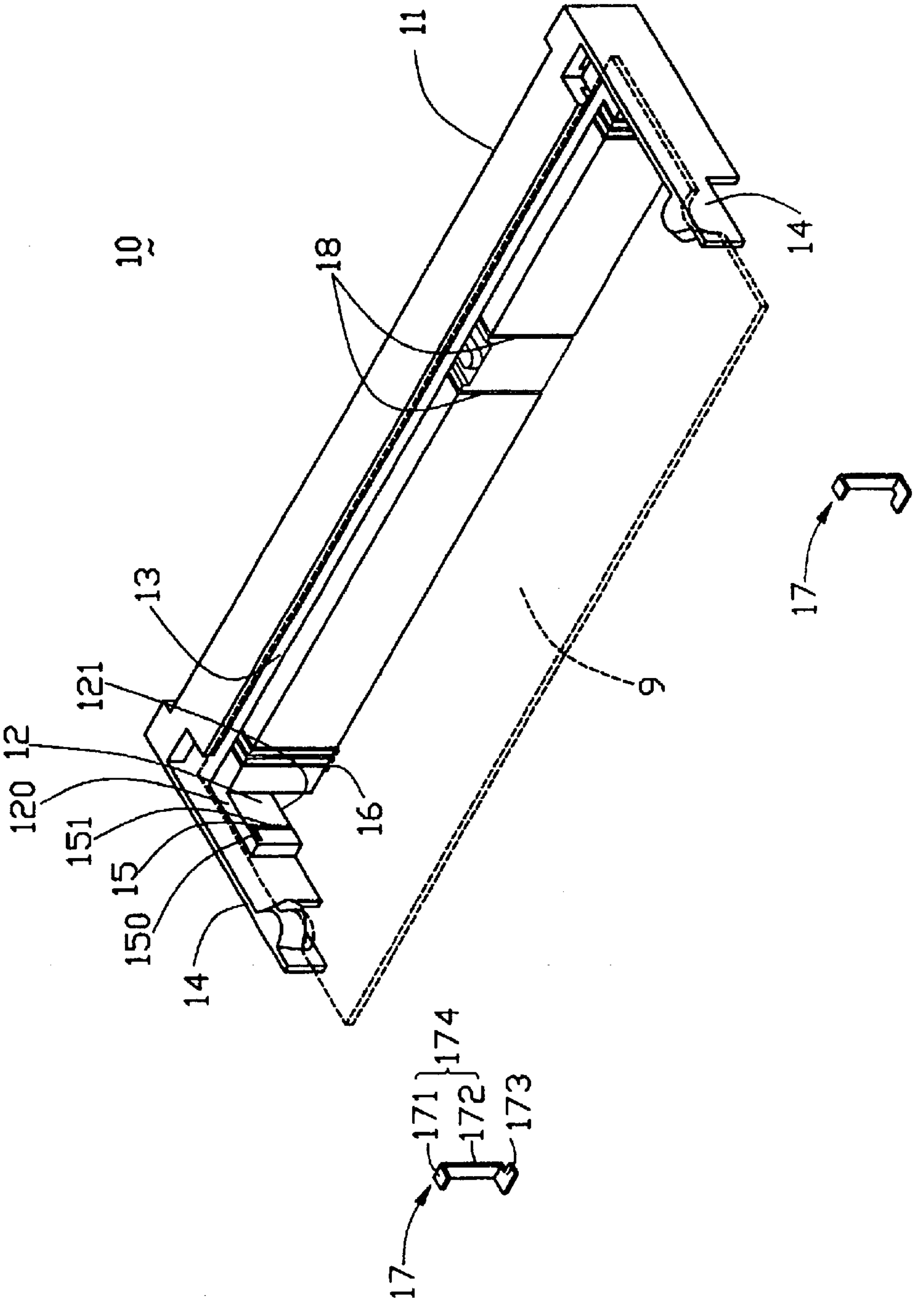
FIG. 1 is an exploded view of a card edge connector constructed in accordance with the present invention.

Reference will now be made to the drawing figures to describe the present invention in detail.

Figure 2:
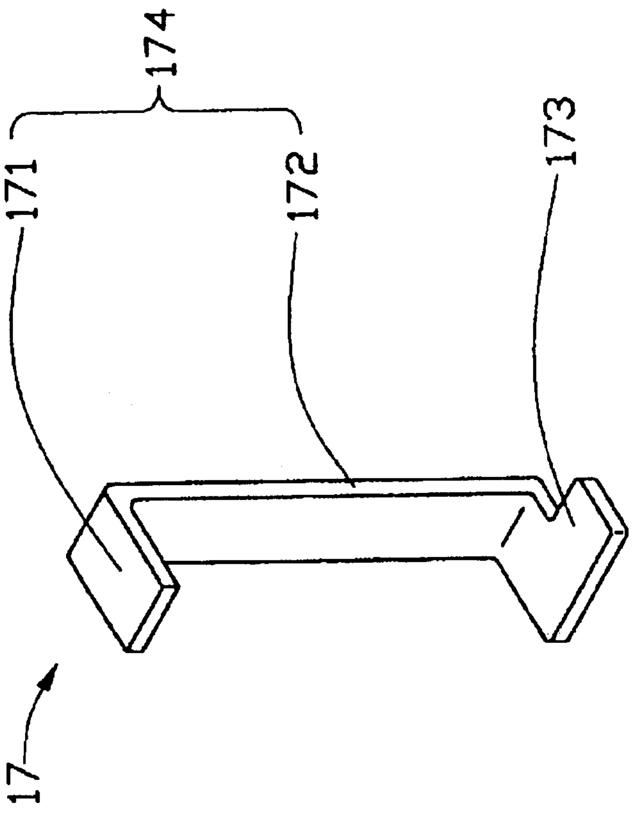
FIG. 2 is an enlarged view of a metal spring.
Figure 3:
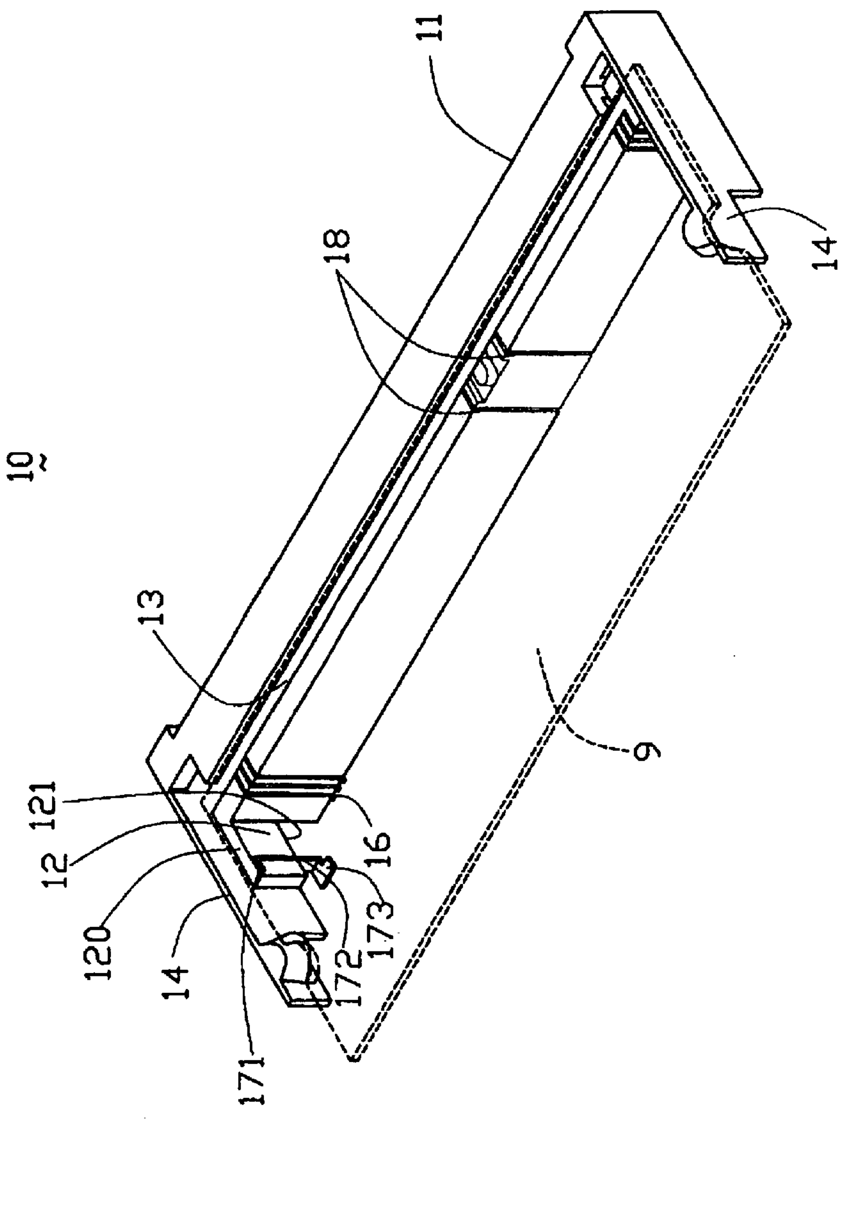
FIG. 3 is an assembled view of FIG. 1.

With reference to FIGS. 1–3, a card edge connector constructed in accordance with the present invention, generally designated with reference numeral 10, comprises a housing 11 made of an insulative material, such as plastics, with a central slot 13 defined therein for receiving a leading edge of a daughter board 9 (shown with phantom lines in FIGS. 1 and 3). The housing 11 also defines a row of passageways 18 (only few shown) receiving and retaining conductive contacts 16 (only some being visible in FIGS. 1 and 3) under the central slot 13 whereby the contacts 16 are engagable with corresponding conductive pads (not shown) on the daughter board 9. The housing 11 can be positioned on a mother board (not shown) with tail portions of the contacts 16 being soldered to the mother board and making the daughter board 9 substantially parallel to the mother board.

Two side arms 14 integrally formed with the housing 11 extend from opposite ends of the housing 11. The arms 14 have inner surfaces facing each other and defining an interior space (not labeled) therebetween for receiving the daughter board 9. The inner surface of each side arm 14 forms a platform 12 extending into the interior space. The platform 12 has a top face 120 serving as a support of the daughter board 9.

Particularly referring to FIG. 1, a retention slit 15 is defined in an inner side of each platform 12, which is configured in a reversed L-shape. The retention slit 15 has a horizontally extended, first slit 150 and a vertically extended, second slit 151 exposed on a bottom face 121 of the platform 12. Detailed structure of the other parts of the side arms 14 would not be described here for they are similar to corresponding configurations of those conventional card edge connectors, such as those described in U.S. Pat. Nos. 6,464,514, 5,997,330 etc., all of which are assigned to the same assignee as the present invention.

As shown in FIG. 2, the card edge connector 10 further comprises a pair of metal springs 17 for mounting to corresponding side arms 14. The metal springs 17 each have a retention member 174 for retaining in corresponding retention slit 15 and a board-mounted member 173 for soldering on the mother board. The retention member 174 is constructed in correspondence with the retention slit 15, and includes a first retention portion 171 received in the horizontally extended, first slit 150 and a second retention portion 172 received in the vertically extended, second slit 151. It should be noted here that the vertically extended, second slit 151 is long enough for substantially retaining the second retention portion 172 therein to thereby increase the reliability of the metal spring 17. The board-mounted members 173 of the metal springs 17 have enough resilience, which are deformable when soldering the contacts 16 on the mother board thereby facilitating the stably assembly of the card edge connector 11 on the mother board.

Referring to FIG. 3 in conjunction with FIG. 1, in assembly, the metal spring 17 is inserted into the retention slit 15 along a horizontal direction with the board-mounted member 173 extending outward the bottom face 121. When mounting the card edge connector 10 on the mother board, the board-mounted member 173 is firstly soldered on the board to facilitate the soldering of the contacts 16, and simultaneously, secure the card edge connector 10 in its proper position on the mother board.

Compared with the conventional card edge connectors, the retention portions 174 of the metal springs 17 of the present invention are substantially retained in the side arms 14 thereby increasing the reliability of the whole metal springs 17 so that the stability of mounting the card edge connector 10 on the mother board is secured.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

I claim:

1. An electrical connector for electrically interconnecting a daughter board to a mother board, comprising:

an insulating housing being adapted for mounting on a mother board and defining a central slot for receiving an edge of a daughter board;

a plurality of contacts retained in said insulating housing and arranged for electrically connecting the daughter board with the mother board;

a pair of side arms integrally formed with said insulating housing, the side arms extending from opposite ends of said housing, each side arm having an inner surface forming a platform for supporting the daughter board, each platform defining thereon a retention slit, each retention slit being configured in a reversed L-shape and comprising a horizontally extended, first slit and a vertically extended second slit; and a pair of metal springs each having a retention member and a resilient, board-mounted member for mounting on the mother board, each retention member having a first retention portion received in said horizontally extended, first slit and a second retention portion received in said vertically extended second slit.

2. The electrical connector as described in claim 1, wherein said resilient, board-mounted member of each metal spring extends horizontally to be soldered on the mother board, the resilient, board-mounted member laving substantial resilience which can be deformable when soldering said contacts on the mother board to thereby facilitate the stably assembling of the electrical connector on the mother board.

3. An electrical connector assembly comprising:

an elongated insulating housing defining a central slot therein with a plurality of contacts by two sides of said central slot;

a pair of side arms integrally formed at two opposite ends of the housing and extending in a back-to-front direction;

each of said side arms defining a platform with an interior surface aside;

a pair of metal springs attached to the corresponding platform, respectively, each of said metal springs including board-mounting member located below a bottom wall of the corresponding platform with a significant distance to perform a standoff function, and extends laterally inwardly beyond the corresponding interior surface; and a daughter board received in the central slot and above said metal springs.

4. The assembly as described in claim 3, wherein each of said metal springs is assembled into a retaining slot in the corresponding platform along a lat ral direction perpendicular to said back-to-front direction.

5. The assembly as described in claim 3, wherein each of said metal springs is generally of a lying U-shaped form with an opening of said lying U-shaped from facing forwardly.

* * * * *